US012604483B2

(12) United States Patent

Mueller

(10) Patent No.: US 12,604,483 B2

(45) Date of Patent: Apr. 14, 2026

(54) MAGNETIC MEMORY DEVICES FOR DIFFERENTIAL SENSING

(71) Applicant: GlobalFoundries U.S. Inc., Malta, NY (US)

(72) Inventor: Johannes Mueller, Dresden (DE)

(73) Assignee: GlobalFoundries U.S. Inc., Malta, NY (US)

( * ) Notice: Subject to any disclaimer, the term of this patent is extended or adjusted under 35 U.S.C. 154(b) by 411 days.

(21) Appl. No.: 18/324,230

(22) Filed: May 26, 2023

(65) Prior Publication Data

US 2024/0397732 A1 Nov. 28, 2024

(51) Int. Cl.
*H10B 61/00* (2023.01)
*H10N 50/20* (2023.01)

(52) U.S. Cl.
CPC ............. *H10B 61/22* (2023.02); *H10N 50/20* (2023.02)

(58) Field of Classification Search
CPC .... H10B 61/22; H10B 61/20; G11C 11/1659; G11C 11/1673; G11C 11/1675; G11C 11/18; H10N 50/10; H10N 50/80; H10N 50/20
See application file for complete search history.

(56) References Cited

U.S. PATENT DOCUMENTS

| | | | | |
|---|---|---|---|---|
| 2018/0102154 | A1* | 4/2018 | Kim | H10B 61/22 |
| 2019/0051820 | A1* | 2/2019 | Sugiyama | G11C 11/18 |
| 2021/0066580 | A1* | 3/2021 | Song | G11C 11/1675 |
| 2021/0210127 | A1* | 7/2021 | Drouard | G11C 11/1675 |
| 2023/0046423 | A1* | 2/2023 | Xing | G11C 11/1673 |

FOREIGN PATENT DOCUMENTS

| | | |
|---|---|---|
| CN | 112420095 A | 2/2021 |
| CN | 110660420 B | 6/2022 |

OTHER PUBLICATIONS

H. Noguchi et al., "7.2 4Mb STT-MRAM-based cache with memory-access-aware power optimization and write-verify-write / read-modify-write scheme," 2016 IEEE International Solid-State Circuits Conference (ISSCC), San Francisco, CA, USA, 2016, pp. 132-133, doi: 10.1109/ISSCC.2016.7417942.

K. Garello et al., "Manufacturable 300mm platform solution for Field-Free Switching SOT-MRAM," 2019 Symposium on VLSI Technology, Kyoto, Japan, 2019, pp. T194-T195, doi: 10.23919/VLSIT.2019.8776537.

Vaishnavi Kateel, "Field-free switching solution for SOT-MRAM", KU Leuven PhD community at IMEC, May 2023 (https://agenda.kuleuven.be/en/content/field-free-switching-solution-sot-mram).

(Continued)

*Primary Examiner* — Sitaramarao S Yechuri

(74) *Attorney, Agent, or Firm* — David Cain

(57) ABSTRACT

A magnetic memory device is provided. The magnetic memory device includes a first magnetic tunnel junction (MTJ) stack, a second MTJ stack, and a spin-orbit torque (SOT) electrode. The second MTJ stack is adjacent to the first MTJ stack. The SOT electrode is connected to the first MTJ stack and the second MTJ stack, wherein the SOT electrode has a first electrode section along a first axis and a second electrode section along a second axis, and the second axis is spaced apart from and parallel to the first axis.

19 Claims, 3 Drawing Sheets

(56)  References Cited

OTHER PUBLICATIONS

S. Shreya and B. K. Kaushik, "Compact Modeling of Differential Spin-Orbit Torque based MRAM," 2018 4th IEEE International Conference on Emerging Electronics (ICEE), Bengaluru, India, 2018, pp. 1-6, doi: 10.1109/ICEE44586.2018.8937873.

Y. Kim, S. H. Choday and K. Roy, "DSH-MRAM: Differential Spin Hall MRAM for On-Chip Memories," in IEEE Electron Device Letters, vol. 34, No. 10, pp. 1259-1261, Oct. 2013, doi: 10.1109/LED.2013.2279153.

A. Aziz, W. Cane-Wissing, M. S. Kim, S. Datta, V. Narayanan and S. K. Gupta, "Single-Ended and Differential MRAMs Based on Spin Hall Effect: A Layout-Aware Design Perspective," 2015 IEEE Computer Society Annual Symposium on VLSI, Montpellier, France, 2015, pp. 333-338, doi: 10.1109/ISVLSI.2015.52.

K. Cai et al., "First demonstration of field-free perpendicular SOT-MRAM for ultrafast and high-density embedded memories," 2022 International Electron Devices Meeting (IEDM), San Francisco, CA, USA, 2022, pp. 36.2.1-36.2.4, doi: 10.1109/IEDM45625.2022.10019360.

European Patent Office, Extended European Search Report and Opinion issued in European Patent Application No. 23198971.6 on Feb. 16, 2024; 8 pages.

* cited by examiner

400

FORM FIRST WORD LINE AND SECOND WORD LINE — 402

FORM FIRST BIT LINE AND SECOND BIT LINE — 404

FORM SOURCE LINE — 406

FORM SOT ELECTRODE — 408

FORM FIRST MTJ STACK AND SECOND MTJ STACK — 410

MAGNETIC MEMORY DEVICES FOR DIFFERENTIAL SENSING

TECHNICAL FIELD

The present disclosure relates generally to semiconductor memory devices, and more particularly to magnetic memory devices providing differential sensing capabilities and methods of forming the same.

BACKGROUND

Magnetic random-access memory (MRAM) is a type of non-volatile memory technology based on magnetoresistance. Because MRAM is non-volatile, MRAM can retain data even when power is turned off. Such data retention makes MRAM suitable for use in a wide range of applications, from computers and smartphones to automotive and aerospace systems. Types of MRAM may include spin-transfer torque magnetic random-access memory (STT-MRAM) and spin-orbit torque magnetic random-access memory (SOT-MRAM).

In particular, SOT-MRAM which provides differential sensing is highly desired as differential sensing improves the reliability and accuracy of data read, making differential sensing a preferred technique for high-performance applications such as cache memory, processors, and solid-state drives.

In order to meet the growing needs of the semiconductor industry, SOT-MRAM providing differential sensing capabilities with improved electrical performances and methods of forming the same are provided.

SUMMARY

To achieve the foregoing and other aspects of the present disclosure, magnetic memory devices providing differential sensing capabilities and methods of forming the same are presented.

According to an aspect of the present disclosure, a magnetic memory device is provided. The magnetic memory device includes a first magnetic tunnel junction (MTJ) stack, a second MTJ stack, and a spin-orbit torque (SOT) electrode. The second MTJ stack is adjacent to the first MTJ stack. The SOT electrode is connected to the first MTJ stack and the second MTJ stack, wherein the SOT electrode has a first electrode section along a first axis and a second electrode section along a second axis, and the second axis is spaced apart from and parallel to the first axis.

According to another aspect of the present disclosure, a magnetic memory device is provided. The magnetic memory device includes a first MTJ stack, a first transistor, a second MTJ stack, a second transistor, a SOT electrode, and a third transistor. The first transistor is coupled to the first MTJ stack. The second MTJ stack is adjacent to the first MTJ stack and coupling to the second transistor. The SOT electrode is connected to the first MTJ stack and the second MTJ stack, wherein the SOT electrode has a first electrode section along a first axis and a second electrode section along a second axis, and the second axis is spaced apart from and parallel to the first axis. The third transistor is coupled to the SOT electrode.

According to yet another aspect of the present disclosure, a method of forming a magnetic memory device is provided. The method includes forming a first MTJ stack and a second MTJ stack, and forming a SOT electrode. The SOT electrode is formed connecting to the first MTJ stack and the second MTJ stack. The second MTJ stack is formed adjacent to the first MTJ stack. The SOT electrode includes a first electrode section along a first axis, the second electrode section along a second axis that is spaced apart from and parallel to the first axis, and a connecting electrode section along a third axis that is substantially perpendicular to the first axis and the second axis.

BRIEF DESCRIPTION OF THE DRAWINGS

The embodiments of the present disclosure will be better understood from a reading of the following detailed description, taken in conjunction with the accompanying drawings.

Figure 1:
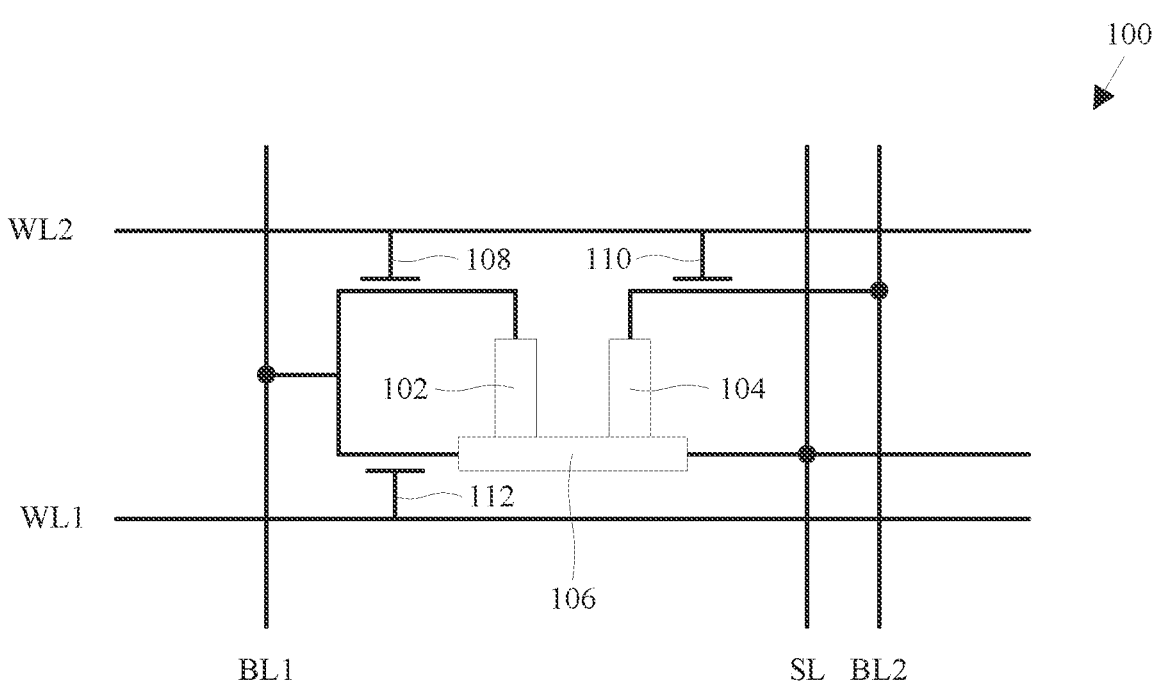
FIG. 1 is a schematic circuit diagram of a magnetic memory device, according to an embodiment of the disclosure.

For simplicity and clarity of illustration, the drawings illustrate the general manner of construction, and certain descriptions and details of well-known features and techniques may be omitted to avoid unnecessarily obscuring the discussion of the described embodiments of the disclosure. Additionally, features in the drawings are not necessarily drawn to scale. For example, the dimensions of some of the features in the drawings may be exaggerated relative to other features to help improve the understanding of the embodiments of the device. The same reference numerals in different drawings denote the same features, while similar reference numerals may, but do not necessarily, denote similar features.

DETAILED DESCRIPTION

The present disclosure relates to magnetic memory devices providing differential sensing with improved electrical performances and methods of forming the same. Various embodiments of the present disclosure are now described in detail with accompanying drawings. It is noted that like and corresponding features are referred to by the use of the same reference numerals. The embodiments disclosed herein are exemplary, and not intended to be exhaustive or limiting to the disclosure.

FIG. 1 is a schematic circuit diagram of a magnetic memory device 100, according to an embodiment of the disclosure. The magnetic memory device 100 may be part of a plurality of memory devices arranged in an array configuration of rows and columns, and only one memory device is illustrated for clarity purposes. The magnetic memory device 100 may be a non-volatile magnetic memory device. In an embodiment, the magnetic memory device 100 is a spin-orbit-torque magnetic random-access memory (SOT-MRAM) device.

The magnetic memory device 100 may include a pair of magnetic tunnel junction (MTJ) stacks 102, 104. The MTJ stacks 102, 104 may be identical to each other and may be capable of storing one true bit and one complementary bit simultaneously. Each MTJ stack 102, 104 may include a tunneling barrier layer between a free magnetic layer and a fixed magnetic layer. The fixed magnetic layer may also be known as a reference magnetic layer with a known and unchangeable magnetization direction. The magnetization direction of the fixed magnetic layers of the MTJ stacks 102, 104 may be aligned in a substantially similar direction. The free magnetic layer, the tunneling barrier layer, and the fixed magnetic layer are not shown in the accompanying drawings so as to not obscure the present disclosure. In an embodiment of the disclosure, the MTJ stacks 102, 104 may be connected, at least electrically, in an anti-series manner.

It will be understood that when an element is referred to as being "connected" or "coupled" to another element, the element can be directly connected or coupled to the other element or intervening elements may be present. In contrast, when an element is referred to as being "directly connected" or "directly coupled" to another element, there are no intervening elements present.

Each MTJ stack 102, 104 may function essentially as a resistor, where the resistance of an electrical path through the MTJ stacks 102, 104 may exist in two resistive states, either "high" or "low," depending on the direction or orientation of magnetization in the free magnetic layer and in the fixed magnetic layer of the respective MTJ stacks 102, 104. In the case that the directions of magnetization in the free magnetic layer and the fixed magnetic layer are substantially opposed or anti-parallel with one another, a high resistive state exists. In the case that the directions of magnetization in the free magnetic layer and the fixed magnetic layer are substantially aligned or parallel with one another, a low resistive state exists. It is to be understood that the terms "low" and "high" with regard to the resistive state of the MTJ stack are relative to one another. In other words, the high resistive state is merely a detectibly higher resistance than the low resistive state, and vice versa. Thus, with a detectible difference in resistance, the low and high resistive states can represent different bits of information (i.e., a "0" or a "1").

In certain aspects and at least some embodiments, certain terms hold certain definable meanings. For example, the "free" layer magnetic layer is a magnetic layer storing a computational variable, such as a bit of information. A "fixed" magnetic layer is a magnetic layer with fixed magnetization. The free magnetic layer and the fixed magnetic layer may be ferromagnetic layers. For example, the free magnetic layer and the fixed magnetic layer may include cobalt, iron, and/or boron. The tunneling barrier layer that may be between the free magnetic layer and the fixed magnetic layer may include an oxide material, for example, magnesium oxide or aluminum oxide.

The magnetic memory device 100 may further include a spin-orbit torque (SOT) electrode 106 contacting the MTJ stacks 102, 104. Specifically, the SOT electrode 106 may be in direct contact with the respective free magnetic layers of the MTJ stacks 102, 104. The SOT electrode 106 may include a heavy metal with high spin-orbit coupling suitable to generate a spin-hall effect and may be present as a bulk metal or dopant. Examples of heavy metals may include tantalum, tungsten, platinum, hafnium, iridium, and bismuth. Alternatively, or additionally, the SOT electrode 106 may include an antiferromagnetic material, for example, cobalt, iron, nickel, manganese, or gallium. Other suitable materials for the SOT electrode 106 are also contemplated as being applicable to all the embodiments of the present disclosure.

The MTJ stacks 102, 104 may be further coupled, at least electrically, to a transistor 108 and a transistor 110, respectively. The SOT electrode 106 may be coupled, at least electrically, to a transistor 112. The transistors 108, 110, 112 may control the flow of charges or current to the MTJ stacks

102, 104, and the SOT electrode 106, respectively. In this embodiment of the disclosure, the magnetic memory device 100 is a three-transistor-two-MTJ stack (3T-2MTJ) MRAM device. For example, the MRAM device comprises three transistors and two MTJ stacks, of which one transistor is connected to each MTJ stack, and the remaining transistor is connected to the SOT electrode.

The magnetic memory device 100 may yet further include bit lines BL1, BL2 forming a complementary bit line pair, a source line SL, and word lines WL1, WL2. The word line WL1 may serve as an electrical route for write operations and the word line WL2 may serve as an electrical route for read operations. The transistor 108 may be coupled, at least electrically, to the bit line BL1 and the word line WL2, in addition to the MTJ stack 102. The transistor 110 may be coupled, at least electrically, to the bit line BL2 and the word line WL2, in addition to the MTJ stack 104. The transistor 112 may be coupled, at least electrically, to the bit line BL1 and the word line WL1, in addition to the SOT electrode 106.

Figure 2A:
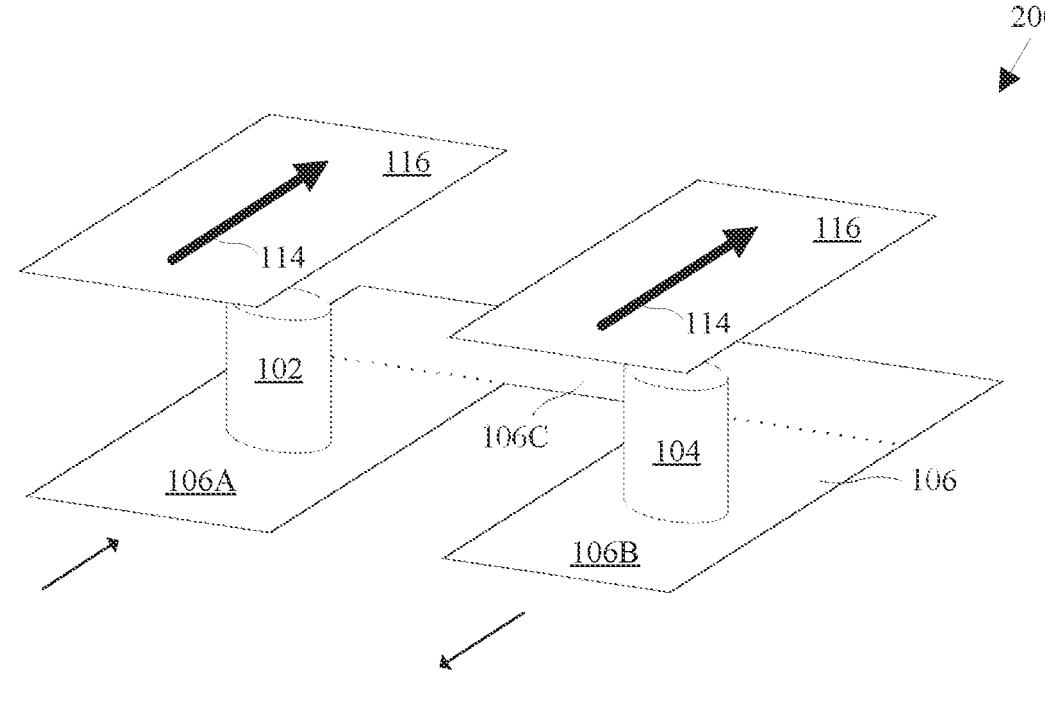
FIG. 2A is a perspective view and FIG. 2B is a plan view of a magnetic memory device, according to an embodiment of the disclosure.
Figure 2B:
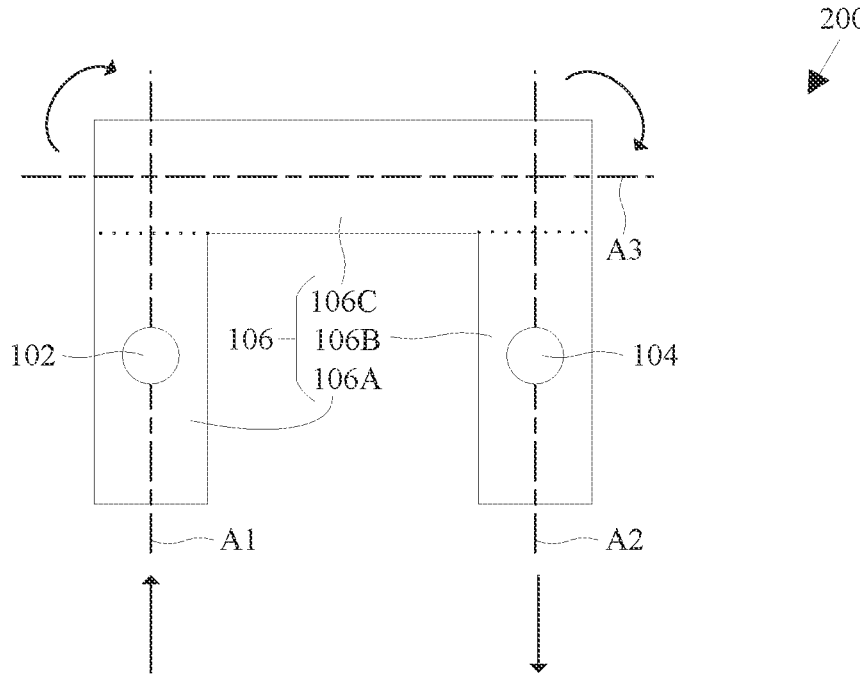

FIG. 2A is a perspective view and FIG. 2B is a plan view of a magnetic memory device 200, according to an embodiment of the disclosure. The magnetic memory device 200 may be connected, at least electrically, in a similar configuration as the schematic circuit diagram in FIG. 1, and common features are labeled with the same reference numerals.

The MTJ stack 102 may be arranged adjacent to the MTJ stack 104, and the SOT electrode 106 may be in direct contact with the MTJ stacks 102, 104. The SOT electrode 106 may be arranged in a manner such that the SOT electrode 106 may be in direct contact with the respective free magnetic layers of the MTJ stacks 102, 104. Even though the SOT electrode 106 is illustrated to be arranged under the MTJ stacks 102, 104, the SOT electrode 106 may be arranged over the MTJ stacks 102, 104, according to an alternative embodiment.

The SOT electrode 106 may include a first electrode section 106A extending along a first axis A1, a second electrode section 106B extending along a second axis A2, and a connecting electrode section 106C extending along a third axis A3. The connecting electrode section 106C may be connecting the first electrode section 106A and the second electrode section 106B at their respective end portions such that the end portions of the connecting electrode section 106C may create a first corner and a second corner of the SOT electrode 106; the transitions of the connecting electrode section 106C to the first electrode section 106A and the second electrode section 106B are diagrammatically shown by a pair of dotted lines for purposes of illustration. The MTJ stack 102 may be arranged on the first electrode section 106A and the MTJ stack 104 may be arranged on the second electrode section 106B of the SOT electrode 106.

The first electrode section 106A may be spaced apart from the second electrode section 106B in a substantially parallel arrangement, for example, the first axis A1 of the first electrode section 106A may be substantially parallel to and spaced apart from the second axis A2 of the second electrode section 106B. The first electrode section 106A and the second electrode section 106B may extend in a similar direction away from the connecting electrode section 106C, for example, the first axis A1 and the second axis A2 may extend away from the third axis A3 in the same direction. The third axis A3 of the connecting electrode section 106C may be substantially perpendicular to the first axis A1 of the first electrode section 106A and to the second axis A2 of the second electrode section 106B. In an embodiment of the disclosure, the SOT electrode 106 may acquire a "U-shaped" profile.

A magnetic field 114 may be applied to the magnetic memory device 200 to provide deterministic magnetization switching of the MTJ stacks 102, 104. The magnetic field 114 may be substantially perpendicular to the MTJ stacks 102, 104 and also substantially parallel to the SOT electrode 106. The magnetic field 114 may also be referred to as an "in-plane" magnetic field. In an embodiment of the disclosure, the direction of the magnetic field 114 may be substantially parallel to the first axis A1 of the first electrode section 106A and the second axis A2 of the second electrode section 106B of the SOT electrode 106.

When the magnetic memory device 200 is "floating", for example, not connected to an electrical signal, the magnetization direction of the free magnetic layers may be perpendicular to or anti-perpendicular to the SOT electrode 106. The magnetic field 114 may be applied in the form of, for example, a magnetic element 116. The magnetic field 114 may be applied over or under the SOT electrode 106, even though the magnetic field 114 is illustrated to be applied over the SOT electrode 106 in FIG. 2. Additionally, even though the magnetic element 116 is illustrated to be a discrete magnetic element over each MTJ stack 102, 104, a single magnetic element may provide the magnetic field 114 over the MTJ stacks 102, 104.

The magnetic memory device 200 may be operated by applying appropriate electrical signals thereto. Table 1 below shows a set of exemplary electrical signals that may be used to operate the magnetic memory device 200 for a write operation, an erase operation, and a read operation. Varying levels of electrical signals may be utilized, depending on the design and technology node of the magnetic memory device 200, without departing from the spirit and scope of the present disclosure.

TABLE 1

|  | WL1 | WL2 | SL | BL1 | BL2 |
|---|---|---|---|---|---|
| WRITE | $V_{DD}$ | $G_{ND}$ | $V_{WRITE}$ | $G_{ND}$ | $G_{ND}$ |
| ERASE | $V_{DD}$ | $G_{ND}$ | $G_{ND}$ | $V_{WRITE}$ | $G_{ND}$ |
| READ | $G_{ND}$ | $V_{DD}$ | $V_{READ}$ | $G_{ND}$ | $G_{ND}$ |

To perform a write operation on the magnetic memory device 200, a write current may flow through the magnetic memory device 200 by an application of voltages $V_{DD}$ and $V_{WRITE}$ to the word line WL1 and the source line SL, respectively, while the word line WL2 and the bit lines BL1, BL2 may be coupled, at least electrically, to ground $G_{ND}$, according to an embodiment of the disclosure. The write current may flow through the SOT electrode 106 from the first electrode section 106A to the second electrode section 106B through the connecting electrode section 106C. A spin-orbit interaction in the SOT electrode 106 may manipulate the magnetization of the respective free magnetic layers of the MTJ stacks 102, 104.

The write current may enter from the first electrode section 106A in a first direction and exit from the second electrode section 106B in a second direction; the second direction may be opposite to the first direction. The write current may turn in a similar direction at the first and second corners of the SOT electrode 106, for example, in a clockwise direction as illustrated in FIG. 2B. Similarly, if the write current flows in an opposite direction, entering from the second electrode section 106B and exiting from the first electrode section 106A, the write current may also turn in a similar direction at the first corner and the second corner of the SOT electrode 106, for example, in an anti-clockwise direction, according to another embodiment of the disclosure.

Opposite net spin polarizations may be generated at the first electrode section 106A and the second electrode section 106B, proximate to an interface between the SOT electrode 106 and the respective MTJ stacks 102, 104 due to the opposite directions of the write current flowing through the first electrode section 106A and the second electrode section 106B. A corresponding spin torque having opposite directions may be generated in the free magnetic layers of the MTJ stacks 102, 104, to change or flip the direction of the respective magnetization of the free magnetic layers.

Depending on the initial direction of the magnetization of the free magnetic layers, the induced spin torque may affect the free magnetic layer of either the MTJ stack 102 or the MTJ stack 104 to flip the magnetization direction. Accordingly, the MTJ stacks 102, 104 may exhibit opposite resistive states, for example, the MTJ stack 102 may exhibit a high resistive state and the MTJ stack 104 may exhibit a low resistive state, or vice versa. Hence, both true and complementary bits may be written to the magnetic memory device 200 concurrently. Advantageously, the write energy required to write both true and complementary bits may be identical in magnitude to the write energy required to write a single bit.

To perform an erase operation on the magnetic memory device 200, an erase current may be induced by an application of voltages $V_{DD}$ and $V_{WRITE}$ to the word line WL1 and the bit line BL, while the word line WL2, the source SL, and the bit line BL2 may be connected to ground $G_{ND}$. The erase current may flow in an opposite direction to the write current in the SOT electrode 106 for the erase operation, for example, the erase current may flow from the second electrode section 106B to the first electrode section 106A through the connecting electrode section 106C.

To perform a read operation on the magnetic memory device 200, voltages $V_{DD}$ and $V_{READ}$ may be applied to the second word line WL2 and the source line SL, respectively, while the first word line WL1, the bit line BL, and the complementary bit line BL may be connected to ground $G_{ND}$. A read current may flow from the source line SL through the MTJ stacks 102, 104 via the SOT electrode 106 to the bit lines BL1, BL2, respectively, to perform the read operation. Data stored in the magnetic memory device 200 may be determined according to the magnitude of a measured read current. For example, if the MTJ stack 102 is in a low resistive state and the MTJ stack 104 is in a high resistive state, a higher read current may flow through the MTJ stack 102, and the magnitude of the measured read current from BL1 will be greater, and vice versa. In an embodiment of the disclosure, the voltage $V_{WRITE}$ may be higher than the voltage $V_{DD}$ and the voltage $V_{DD}$ may be higher than the voltage $V_{READ}$.

Figure 3:
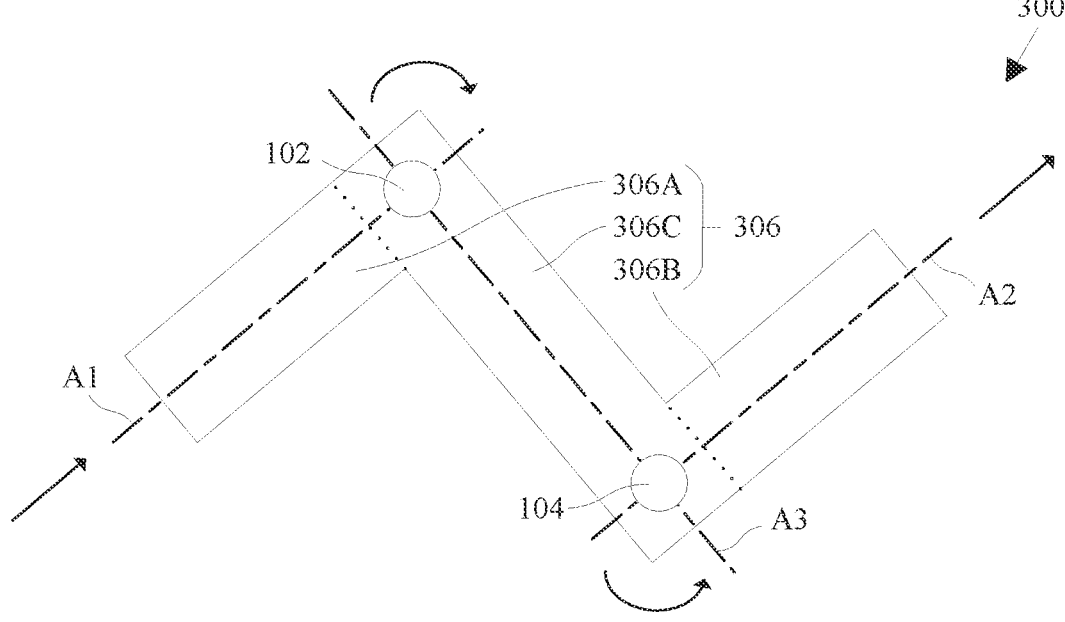
FIG. 3 is a perspective view of a magnetic memory device, according to another embodiment of the disclosure.

FIG. 3 is a perspective view of a magnetic memory device 300, according to another embodiment of the disclosure. The magnetic memory device 300 may be similar to the magnetic memory device 200 in FIG. 2, and thus, common features are labeled with the same reference numerals.

Similar to the magnetic memory device 200 in FIGS. 2A and 2B, the MTJ stack 102 may be adjacent to the MTJ stack 104. A SOT electrode 306 may be in direct contact with the MTJ stacks 102, 104, in particular, with the respective free magnetic layers (not shown) of the MTJ stacks 102, 104. The SOT electrode 106 may also include a first electrode section 306A extending along a first axis A1, a second electrode section 306B extending along a second axis A2, and a connecting electrode section 306C extending along a third axis A3. The first axis A1 and the second axis A2 may be spaced apart and substantially parallel to each other, while the third axis A3 may be substantially perpendicular to the first axis A1 and the second axis A2.

The connecting electrode section 306C may also be connecting the first electrode section 306A and the second electrode section 306B at their respective end portions such that the end portions of the connecting electrode section 306C may create a first corner and a second corner of the SOT electrode 306; the transition of the connecting electrode section 306C to the first electrode section 306A and the second electrode section 306B is diagrammatically shown by a pair of dotted lines for purposes of illustration. The MTJ stacks 102, 104 may be arranged at the first corner and the second corner of the SOT electrode 106, respectively.

However, unlike the SOT electrode 106 in FIGS. 2A and 2B, the first electrode section 306A and the second electrode section 306B may not extend in a similar direction away from the connecting electrode section 306C. For example, the first axis A1 of the first electrode section 306A and the second axis A2 of the second electrode section 306B may extend in an opposite direction away from the connecting electrode section 306C. The SOT electrode 106 may enable a current to turn in opposite directions at the first and second corners. For example, when a current flows through the SOT electrode 106 entering from the first electrode section 306A, the current may turn in a clockwise direction at the first corner and turn in an anti-clockwise direction at the second corner to exit from the second electrode section 306B. In an embodiment of the disclosure, the SOT electrode 106 may acquire an "S-shaped" profile.

Similar electrical signals may be applied to the magnetic memory device 300 for a write operation, an erase operation, and a read operation, as illustrated in Table 1. Due to the opposite directions of the write current through the first electrode section 306A and the second electrode section 306B, for example, a clockwise direction and an anti-clockwise direction as illustrated, opposite net spin polarizations may be generated at the first corner and the second corner of the SOT electrode 306, proximate to an interface between the SOT electrode 306 and respective the MTJ stacks 102, 104. A corresponding spin polarization may be generated in the free magnetic layers of the MTJ stacks 102, 104, to change the resistive states of the MTJ stacks 102, 104 to change or flip the direction of the respective magnetization of the free magnetic layers.

Accordingly, the magnetization direction of the free magnetic layers of the MTJ stacks 102, 104 may be aligned in an opposite direction to each other. For example, the magnetization direction of the free magnetic layer of the MTJ stack 102 may be aligned substantially parallel to and the magnetization direction of the free magnetic layer of the MTJ stack 104 may be aligned substantially anti-parallel to the magnetization direction of their respective fixed magnetic layers. In this manner, the MTJ stacks 102, 104 may exhibit opposite resistive states, for example, the MTJ stack 102 may exhibit a high resistive state and the MTJ stack 104 may exhibit a low resistive state, or vice versa. Hence, both true and complementary bits may be written to the magnetic memory device 300 concurrently. Advantageously, the write energy required to write both true and complementary bits may be identical in magnitude to the write energy required to write a single bit.

Figure 4:
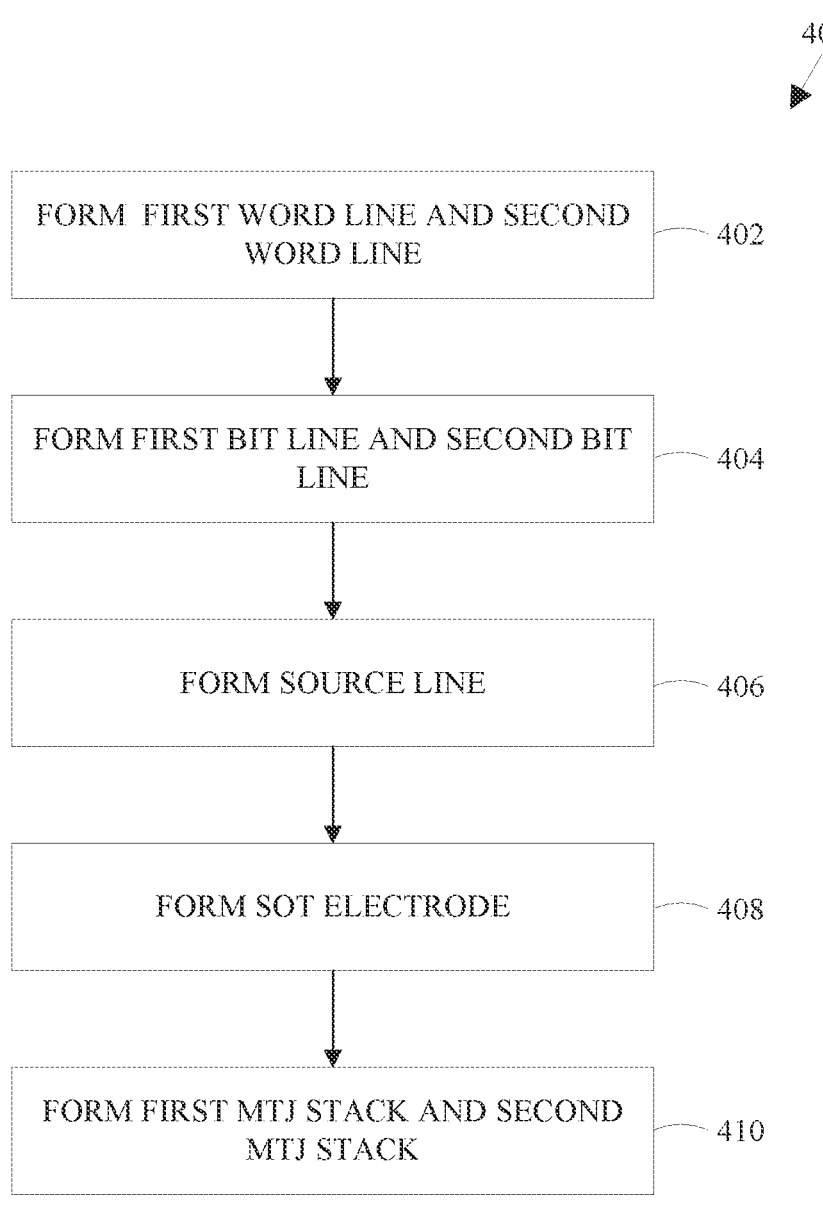
FIG. 4 is a flow chart illustrating a method of forming the magnetic memory device in FIGS. 2A and 2B, according to an embodiment of the disclosure.

FIG. 4 is a flow chart 400 illustrating a method of forming a magnetic memory device, according to an embodiment of the disclosure. The magnetic memory device may be similar to the magnetic memory device 200 of FIGS. 2A and 2B or the magnetic memory device 300 of FIG. 3. Certain structures may be fabricated, for example, using known processes and techniques, and specifically disclosed processes and methods may be used to achieve individual aspects of the present disclosure. The below-described order for the method of forming the magnetic memory device is intended to be illustrative, and the method is not limited to the specifically described order unless otherwise specifically stated.

As used herein, "deposition techniques" refer to the process of applying a material over another material. Exemplary techniques for deposition include, but not limited to, spin-on coating, sputtering, chemical vapor deposition (CVD), physical vapor deposition (PVD), molecular beam deposition (MBD), pulsed laser deposition (PLD), liquid source misted chemical deposition (LSMCD), or atomic layer deposition (ALD).

Additionally, "patterning techniques" include deposition of material or photoresist, patterning, exposure, development, etching, cleaning, and/or removal of the material or photoresist as required in forming a described pattern, structure, or opening. Exemplary examples of techniques for patterning include, but not limited to, wet etch photolithographic processes, dry etch photolithographic processes, or direct patterning processes.

A substrate may be provided, where active and/or passive devices may be formed therein or thereupon. A first word line and a second word line may be formed over the substrate, as illustrated by operation 402. The first and second word lines may be synonymous with the word lines WL1, WL2 in FIG. 1, respectively. The first word line may be spaced apart from and substantially parallel to the second word line. Additionally, the first and second word lines may be identical, differing only in their functions. For example, the first word line may be provided to perform write operations while the second word line may be provided to perform read operations. In an embodiment of the disclosure, the first and second word lines may be formed on the same level over the substrate.

A first bit line and a second bit line may be formed over the substrate, as illustrated by operation 404. The first and second bit lines may be synonymous with the bit lines BL1, BL2 in FIG. 1, respectively, and may form a complementary bit line pair. The first bit line may be spaced apart from and substantially parallel to the second bit line. The first and second bit lines may be formed on a different level from the first and second word lines. In an embodiment of the disclosure, the first and second bit lines may be formed on the same level over the substrate.

A source line may be formed over the substrate, as illustrated by operation 406. The source line may be synonymous with the source line SL in FIG. 1. The source line may be formed parallel to and between the first and second bit lines. In an embodiment of the disclosure, the source line may be formed on the same level as the first and second bit lines. In an alternative embodiment of the disclosure, the source line may be formed on a different level from the first and second bit lines.

An exemplary method of forming the first and second word lines, the first and second bit lines, and the source line is described herein. The first and second word lines, the first and second bit lines, and the source line may be respectively formed by depositing a dielectric layer over the substrate using a deposition technique, forming openings in the dielectric layer using a patterning technique, and filling the openings with a conductive material using a deposition technique to form the corresponding first and second word lines, the first and second bit lines, and the source line.

A SOT electrode may be formed over the substrate, as illustrated by operation 408. The SOT electrode may be synonymous with the SOT electrode 106 in FIGS. 2A and 2B or the SOT electrode 306 in FIG. 3. The SOT electrode may be arranged between the first and second bit lines, and further over the source line. The SOT electrode may be coupled to the source line using, for example, a contact structure and/or a bridging structure. The SOT electrode may be additionally coupled to the first word line using at least a contact structure.

An exemplary method of forming the SOT electrode is described herein. The SOT electrode may be formed by depositing a dielectric layer at least over the source line and the first word line using a deposition technique and forming an opening in the dielectric layer using a patterning technique. The opening may include a first opening section, a second opening section, and a third opening section. In an embodiment of the disclosure, the first, second, and third opening sections may be formed in a single process step.

The opening may be subsequently filled with a conductive material using a deposition technique to form the SOT electrode. In particular, a first electrode section may be formed in the first opening section, a second electrode section may be formed in the second opening section and a connecting electrode section may be formed in the third opening section. The first, second, and third electrode sections may be synonymous with the first electrode section 106A, the second electrode section 106B, and the connecting electrode section 106C in FIGS. 2A and 2B, or the first electrode section 306A, the second electrode section 306B, and the connecting electrode section 306C in FIG. 3. The conductive material may include a heavy metal or an anti-ferromagnetic material.

First and second MTJ stacks may be formed over the SOT electrode, as illustrated by operation 410. The first and second MTJ stacks may be synonymous with the MTJ stacks 102, 104 in FIGS. 2A and 2B or FIG. 3. The first and second MTJ stacks may be identical to each other and may be capable of storing one true bit and one complementary bit simultaneously. Each MTJ stack may include a tunneling barrier layer between a free magnetic layer and a fixed magnetic layer. The magnetization direction of the fixed magnetic layers in the first and second MTJ stacks may be aligned in a substantially similar direction.

An exemplary method of forming the first and second MTJ stacks is described herein. A plurality of layers may be sequentially deposited using at least a deposition technique. The plurality of layers may include a layer of free magnetic material, a layer of tunneling barrier material, and a layer of fixed magnetic material. The free magnetic layer and the fixed magnetic layer may include cobalt, iron, and/or boron. The tunneling barrier layer that may be between the free magnetic layer and the fixed magnetic layer may include an oxide material, for example, magnesium oxide or aluminum oxide. The plurality of layers may be patterned using a patterning technique to form the first and second MTJ stacks. The deposition technique and the patterning technique may each include a single-step process or a multi-step process.

Processing continues with the formation of transistors to couple, at least electrically, the first and second MTJ stacks, as well as to the SOT electrode, using techniques known in the art, as illustrated in FIG. 1.

The terms "top", "bottom", "over", "under", and the like in the description and the claims, if any, are used for descriptive purposes and not necessarily for describing permanent relative positions. It is to be understood that the terms so used are interchangeable under appropriate circumstances such that the embodiments of the devices described herein are, for example, capable of operation in other orientations than those illustrated or otherwise described herein.

Additionally, the formation of a first feature over or on a second feature in the description that follows may include embodiments in which the first and second features are formed in direct contact, and may also include embodiments in which additional features may be formed by interposing the first and second features, such that the first and second features may not be in direct contact.

Similarly, if a method is described herein as involving a series of steps, the order of such steps as presented herein is not necessarily the only order in which such steps may be performed, and certain of the stated steps may possibly be omitted and/or certain other steps not described herein may possibly be added to the method. Furthermore, the terms "comprise", "include", "have", and any variations thereof, are intended to cover a non-exclusive inclusion, such that a process, method, article, or device that comprises a list of features is not necessarily limited to those features but may include other features not expressly listed or inherent to such process, method, article, or device. Occurrences of the phrase "in an embodiment" herein do not necessarily all refer to the same embodiment.

In addition, unless otherwise indicated, all numbers expressing quantities, ratios, and numerical properties of materials, reaction conditions, and so forth used in the specification and claims are to be understood as being modified in all instances by the term "about".

Furthermore, approximating language, as used herein throughout the specification and claims, may be applied to modify any quantitative representation that could permissibly vary without resulting in a change in the basic function to which it is related. Accordingly, a value modified by a term or terms, such as "approximately", "about," or "substantially" is not limited to the precise value specified. In some instances, the approximating language may correspond to the precision of an instrument for measuring the value. In other instances, the approximating language may correspond to within normal tolerances of the semiconductor industry. For example, "substantially coplanar" means substantially in a same plane within normal tolerances of the semiconductor industry, and "substantially perpendicular" means at an angle of 90 degrees plus or minus a normal tolerance of the semiconductor industry.

While several exemplary embodiments have been presented in the above-detailed description of the device, it should be appreciated that a number of variations exist. It should further be appreciated that the embodiments are only examples, and are not intended to limit the scope, applicability, dimensions, or configuration of the device in any way. Rather, the above-detailed description will provide those skilled in the art with a convenient road map for implementing an exemplary embodiment of the device, it being understood that various changes may be made in the function and arrangement of features and methods of fabrication described in an exemplary embodiment without departing from the scope of this disclosure as set forth in the appended claims.

What is claimed is:

1. A magnetic memory device, comprising:
a first magnetic tunnel junction (MTJ) stack;
a second MTJ stack adjacent to the first MTJ stack;
a spin-orbit torque (SOT) electrode connected to the first MTJ stack and the second MTJ stack, wherein the SOT electrode has a first electrode section along a first axis and a second electrode section along a second axis, the second axis is spaced apart from and parallel to the first axis; and
a connecting electrode section along a third axis substantially perpendicular to the first axis and the second axis, wherein the first axis and the second axis extend away from the third axis in opposite directions.

2. The magnetic memory device of claim 1, the connecting electrode section comprises a first end portion connecting to the first electrode section and a second end portion connected to the second electrode section.

3. The magnetic memory device of claim 2, wherein the first MTJ stack is in contact with the first electrode section and the second MTJ stack is in contact with the second electrode section.

4. The magnetic memory device of claim 2, wherein the first MTJ stack at a corner of the SOT electrode where the first electrode section connects to the connecting electrode section.

5. The magnetic memory device of claim 4, wherein the second MTJ stack is at a corner of the SOT electrode where the second electrode section connects to the connecting electrode section.

6. The magnetic memory device of claim 1, wherein the first MTJ stack and the second MTJ stack each comprise a tunneling barrier layer between a free magnetic layer and a fixed magnetic layer, wherein the magnetization direction of the fixed magnetic layers of the first MTJ stack and the second MTJ stack are aligned in a substantially similar direction.

7. The magnetic memory device of claim 6, further comprising a magnetic element, and a magnetic field direction of the magnetic element is substantially parallel to the first axis.

8. The magnetic memory device of claim 1, wherein the magnetic memory device includes a magnetic random-access memory (MRAM) comprising three transistors and two MTJ stacks.

9. The magnetic memory device of claim 8, wherein the magnetic memory device is capable of storing one true bit in the first MTJ stack and one complementary bit in the second MTJ stack.

10. A magnetic memory device, comprising:
a first magnetic tunnel junction (MTJ) stack;
a first transistor coupled to the first MTJ stack;
a second MTJ stack adjacent to the first MTJ stack;
a second transistor coupled to the second MTJ stack;
a spin-orbit torque (SOT) electrode connected to the first MTJ stack and the second MTJ stack, wherein the SOT electrode has a first electrode section along a first axis, a second electrode section along a second axis, the second axis is spaced apart from and parallel to the first axis, and a connecting electrode section along a third axis substantially perpendicular to the first axis and the second axis, wherein the first axis and the second axis extend away from the third axis in opposite directions; and
a third transistor coupled to the SOT electrode.

11. The magnetic memory device of claim 10, further comprising a first bit line and a second bit line, wherein the first bit line is coupled to the first transistor and the second transistor, and the second bit line is coupled to the third transistor.

12. The magnetic memory device of claim 11, further comprising a source line, wherein the source line is coupled to the SOT electrode.

13. The magnetic memory device of claim 12, further comprising a first word line and a second word line, wherein the first word line is coupled to the third transistor and the second word line is coupled to the first transistor and the second transistor.

14. The magnetic memory device of claim 13, wherein the first word line serves as an electrical route for a write operation of the magnetic memory device.

15. The magnetic memory device of claim 14, wherein the second word line serves as an electrical route for a read operation of the magnetic memory device.

16. A method of forming a magnetic memory device, comprising:
forming a first magnetic tunnel junction (MTJ) stack and a second MTJ stack; and
forming a spin-orbit torque (SOT) electrode including forming a first electrode section, forming a second electrode section, and forming a connecting electrode section, wherein the first electrode section is formed along a first axis, the second electrode section is formed along a second axis that is spaced apart from and parallel to the first axis, and the connecting electrode section is formed along a third axis that is substantially perpendicular to the first axis and the second axis, wherein the first axis and the second axis extend away from the third axis in opposite directions.

17. The method of claim 16, wherein the connecting electrode section comprises a first end portion and a second end portion, and forming the connecting electrode section comprises forming the first end portion to be connected to the first electrode section and the second end portion to be connected to the second electrode section.

18. The method of claim 16, further comprising forming a first bit line coupled to the first MTJ stack and a second bit line coupled to the second MTJ stack and the SOT electrode.

19. The method of claim 18, further comprising forming a first word line coupled to the SOT electrode and a second word line coupled to the first MTJ stack and the second MTJ stack.

* * * * *